(12) United States Patent
Jiang et al.

(10) Patent No.: US 9,382,619 B2
(45) Date of Patent: Jul. 5, 2016

(54) CLEANING APPARATUS AND METHOD, AND FILM GROWTH REACTION APPARATUS AND METHOD

(75) Inventors: Yinxin Jiang, Shanghai (CN); Yijun Sun, Shanghai (CN); Zhiyou Du, Shanghai (CN)

(73) Assignee: Advanced Micro-Fabrication Equipment, Inc., Shanghai (CN)

( * ) Notice: Subject to any disclaimer, the term of this patent is extended or adjusted under 35 U.S.C. 154(b) by 1127 days.

(21) Appl. No.: 13/440,862

(22) Filed: Apr. 5, 2012

(65) Prior Publication Data

US 2012/0255486 A1 Oct. 11, 2012

(30) Foreign Application Priority Data

Apr. 7, 2011 (CN) .......................... 2011 1 0087164

(51) Int. Cl.
*C23C 16/44* (2006.01)
*C23C 16/458* (2006.01)

(52) U.S. Cl.
CPC .......... *C23C 16/4407* (2013.01); *C23C 16/4405* (2013.01); *C23C 16/458* (2013.01)

(58) Field of Classification Search
CPC combination set(s) only.
See application file for complete search history.

(56) References Cited

U.S. PATENT DOCUMENTS

| | | | |
|---|---|---|---|
| 5,286,301 A | 2/1994 | Albrecht | |
| 5,330,577 A * | 7/1994 | Maeda | ................ C23C 16/4407 118/722 |
| 5,589,001 A | 12/1996 | Maeda et al. | |
| 2002/0139682 A1 | 10/2002 | Basol et al. | |
| 2004/0231706 A1 | 11/2004 | Bhatnagar et al. | |

FOREIGN PATENT DOCUMENTS

| | | |
|---|---|---|
| CN | 201263660 Y | 7/2009 |
| CN | 101497443 A | 8/2009 |
| JP | 08153684 | 6/1996 |
| JP | 2002249394 A | 9/2002 |
| KR | 20030093294 A | 12/2003 |

OTHER PUBLICATIONS

Notice of Allowance dated Nov. 18, 2014 in a Korean counterpart application, 4 pages.
Office Action issued May 29, 2014 for Korea counterpart application 10-2012-0036653.

* cited by examiner

*Primary Examiner* — Duy Deo
*Assistant Examiner* — Erin Bergner
(74) *Attorney, Agent, or Firm* — Kilpatrick Townsend & Stockton LLP

(57) ABSTRACT

Disclosed herein is an apparatus for cleaning an inner surface of a film growth reaction chamber, including a supporting unit, a cleaning unit, an electric motor and a power supply apparatus. The cleaning unit includes a surface facing the inner surface of the reaction chamber, and the surface is provided with a plurality of scraping structures. The electric motor is provided on the supporting unit and includes a driving shaft. One end of the driving shaft is connected to the cleaning unit so as to drive the cleaning unit to move. The power supply apparatus is connected to the electric motor. The cleaning apparatus of the present application provides a method for cleaning the inner surface of the reaction chamber, which is highly automatic, effective and timesaving, and may ensure the quality and consistency of cleaning process.

37 Claims, 9 Drawing Sheets

CLEANING APPARATUS AND METHOD, AND FILM GROWTH REACTION APPARATUS AND METHOD

The present application claims the benefit of priority to Chinese patent application No. 201110087164.9 titled "CLEANING APPARATUS AND METHOD, AND FILM GROWTH REACTION APPARATUS AND METHOD", filed with the Chinese State Intellectual Property Office on Apr. 7, 2011. The entire disclosure thereof is incorporated herein by reference.

FIELD OF THE INVENTION

The present application relates to an apparatus and method for film growth, in particular to an apparatus and method for cleaning an inner surface of a film growth reaction chamber, and to a reaction apparatus and method for film growth on a substrate.

BACKGROUND OF THE INVENTION

As a kind of typical group III and group V element compound films, gallium nitride (GaN) is a material widely used to manufacture a blue light emitting diode, a purple light emitting diode, a white light emitting diode, an ultraviolet detector and a high power microwave transistor. Since GaN has practical and potential applications in manufacturing low energy consumption devices (such as an LED) which are widely used, GaN film growth has attracted great attention.

The GaN film may grow with various methods, including a molecular beam epitaxy (MBE) method, a hydride vapor phase epitaxy (HVPE) method, a metal organic chemical vapor deposition (MOCVD) method and so on. At present, the MOCVD method is a preferred deposition method for obtaining a film with enough quality used for the manufacture of an LED.

The MOCVD process is generally performed in a reactor or a reaction chamber at a relatively high temperature by a thermal processing method. Generally, a first precursor gas including a group III element (such as gallium (Ga)) and a second precursor gas (such as ammonia ($NH_3$)) including nitrogen are fed into the reaction chamber by a gas transportation apparatus to react so as to form a GaN film on a heated substrate. A carrier gas may also be used to assist the transportation of the precursor gases onto the substrate. A group III nitride film (such as a GaN film) is formed by the mixed reaction of the precursor gases on a heated surface of the substrate and then is deposited on the surface of the substrate.

However, during the MOCVD film growth process, the GaN film or other reaction products are not only grown or deposited on the substrate, but also grown or deposited on the inner surface of the reaction chamber including the surface of the gas transportation apparatus. These undesired deposits or residues are accumulated, which may produce adhered aggregates such as powder and particles in the reaction chamber, and may peel off from the adhering surface to spread everywhere in the reaction chamber along with the flow of the reaction gases and to finally fall on the processed substrate, thereby causing defects or ineffective of the substrate and contamination in the reaction chamber which has adverse effects on the quality of the next MOCVD process. Thus, after the MOCVD film growth process is performed for a period of time, the film growth process has to be stopped to specially carry out a cleaning process for the reaction chamber, i.e. to remove the aggregates adhered to the gas transportation apparatus.

At present, the method for cleaning the gas transportation apparatus in the art is "manual cleaning". That is, an operator must stop the film growth process, open a top cover of the reaction chamber after the temperature in the reaction chamber is reduced to a certain temperature, manually brush away the deposits or residues adhered to the gas transportation apparatus from the adhering surface with a brush, and remove them to the outside of the reaction chamber by a vacuum suction method. If the deposits or residues are very thick, the operator needs to manually scrape off them from the adhering surface with a tool and remove them to the outside of the reaction chamber. This cleaning method has some disadvantages. Specifically, for performing the cleaning process, the film growth process needs to be stopped, and it has to wait for a quite long time allowing the temperature in the reaction chamber to be reduced to a suitable temperature for the manual cleaning, and it has to be manually performed by the operator under the condition that the top cover of the reaction chamber is opened. Thus, for a user of the reaction chamber, the throughput of the process production of the reaction chamber is reduced, and the use cost of the producer is increased. Further, due to the "manual cleaning", it is impossible to realize automatic cleaning process of the system, and to ensure the consistent results of cleaning process, causing that deviations and defects in process quality may occur in the subsequent film growth process.

Therefore, there is a need to develop an apparatus and method for cleaning the gas transportation apparatus and the inner surface of the reaction chamber, which is highly automatic, effective and timesaving, and may ensure the quality and consistency of cleaning, and does not have adverse effects on the subsequent film growth.

SUMMARY OF THE INVENTION

In view of the above problems in the prior art, an object of the present application is to provide a cleaning apparatus and method for in-situ cleaning an inner surface of a film growth reaction chamber, which are highly automatic, effective and timesaving.

Another object of the present application is to provide a reaction apparatus for film growth on a substrate.

Another object of the present application is to provide a method for removing adhered aggregates on the inner surface of the film growth reaction chamber.

Another object of the present application is to provide a method for film growth in a reaction chamber.

According to one aspect of the present application, an apparatus for cleaning an inner surface of a film growth reaction chamber is provided, including:

a supporting unit including a supporting surface;

a cleaning unit including a surface facing the inner surface of the reaction chamber, the surface being provided with a plurality of scraping structures;

an electric motor provided on the supporting unit and including a driving shaft, one end of the driving shaft being connected to the cleaning unit so as to drive the cleaning unit to move; and a power supply apparatus connected to the electric motor.

According to another aspect of the present application, a reaction apparatus for film growth on a substrate, including:

a reaction chamber;

a supporting apparatus provided inside the reaction chamber and including a supporting end or supporting surface;

a substrate carrier configured to convey and support the substrate, wherein the substrate carrier is detachably placed on the supporting end or a supporting surface of the supporting apparatus and contacts with the supporting end or the supporting surface of the supporting apparatus at least during the film growth process, and the substrate carrier can be easily removed from the supporting apparatus and moved out of the reaction chamber so as to load or unload the substrate;

a cleaning apparatus, wherein the cleaning apparatus is detachably placed on the supporting end or a supporting surface of the supporting apparatus and contacts with the supporting end or the supporting surface of the supporting apparatus at least during a cleaning process, the cleaning apparatus can be easily removed from the supporting apparatus and moved out of the reaction chamber, and the cleaning apparatus includes:

a supporting unit including a supporting surface;

a cleaning unit including a surface facing the inner surface of the reaction chamber, the surface being provided with a plurality of scraping structures;

an electric motor provided on the supporting unit and including a driving shaft, one end of the driving shaft being connected to the cleaning unit so as to drive the cleaning unit to move; and a power supply apparatus connected to the electric motor.

According to a further aspect of the present application, an apparatus for cleaning an inner surface of a film growth reaction chamber, including:

a supporting unit including a supporting surface;

a cleaning unit including a surface facing the inner surface of the reaction chamber, the surface being provided with a plurality of scraping structures;

an electric motor provided on the supporting unit, including a driving shaft and configured to provide a rotation motion;

a motion converting mechanism provided between the driving shaft of the electric motor and the cleaning unit, and configured to convert the rotation motion of the electric motor into other motions and to drive the cleaning unit to make the other motions; and a power supply apparatus connected to the electric motor.

According to still another aspect of the present application, a reaction apparatus for film growth on a substrate, including:

a reaction chamber;

a supporting apparatus provided inside the reaction chamber and including a supporting end or supporting surface;

a substrate carrier configured to convey and support the substrate, wherein the substrate carrier is detachably placed on the supporting end or a supporting surface of the supporting apparatus and contacts with the supporting end or the supporting surface of the supporting apparatus at least during the film growth process, and the substrate carrier can be easily removed from the supporting apparatus and moved out of the reaction chamber so as to load or unload the substrate;

a cleaning apparatus, wherein the cleaning apparatus is detachably placed on the supporting end or a supporting surface of the supporting apparatus and contacts with the supporting end or the supporting surface of the supporting apparatus at least during a cleaning process, the cleaning apparatus can be easily removed from the supporting apparatus and moved out of the reaction chamber, and the cleaning apparatus includes:

a supporting unit including a supporting surface;

a cleaning unit including a surface facing the inner surface of the reaction chamber, the surface being provided with a plurality of scraping structures;

an electric motor provided on the supporting unit, including a driving shaft and configured to provide a rotation motion;

a motion converting mechanism provided between the driving shaft of the electric motor and the cleaning unit and configured to convert the rotation motion of the electric motor into other motions and to drive the cleaning unit to make the other motions; and a power supply apparatus connected to the electric motor.

Compared with the prior art, the cleaning apparatus, the reaction apparatus, the cleaning method and the film growth method provided by the present application have some advantages. For example, the whole process for cleaning or removing the adhered aggregates on the inner surface of the film growth reaction chamber may be performed without the need of opening the reaction chamber cover, and thus it is an in-situ cleaning method. The whole process may be realized automatically. Furthermore, the cleaning method is simple, convenient, and may ensure the quality and consistency of cleaning process so as to avoid having adverse effects on the subsequent film growth. In general, the producer's cost is greatly reduced and the effective processing uptime of the whole film growth apparatus is greatly improved.

BRIEF DESCRIPTION OF THE DRAWINGS

FIG. 2b is a perspective schematic view of a cleaning unit of the cleaning apparatus as shown in FIG. 2a;

FIG. 3b is a perspective schematic view of the partial structure of the cleaning apparatus as shown in FIG. 3a;

DETAILED DESCRIPTION OF THE EMBODIMENTS

The present application will be described in detail in conjunction with drawings and embodiments hereinafter.

Figure 1:
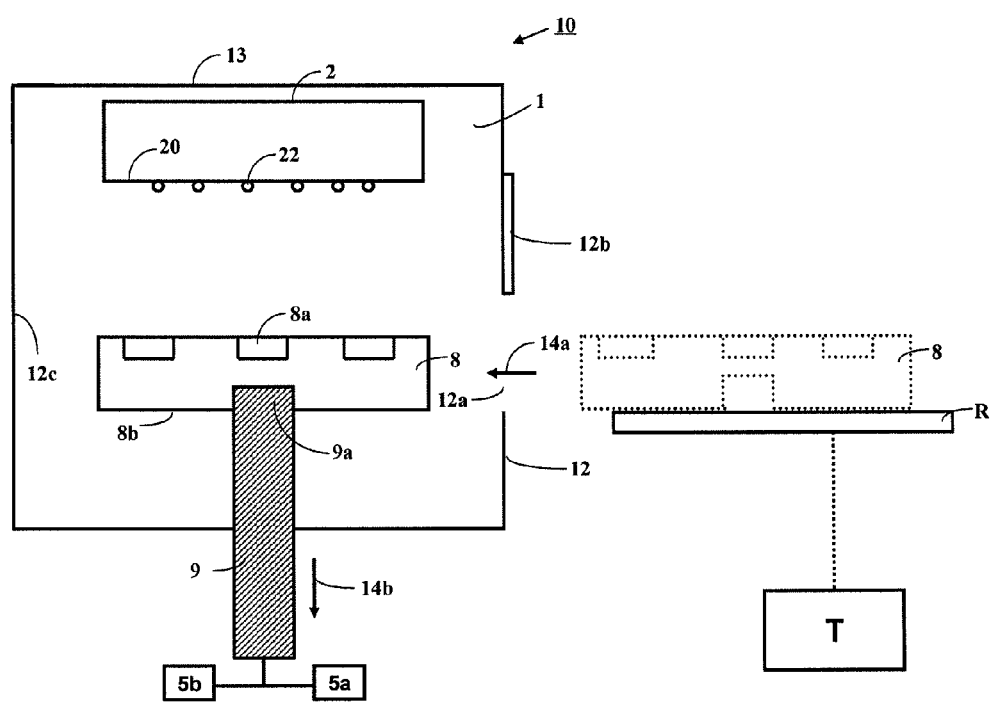
FIG. 1 is a schematic view of a film growth apparatus in the prior art.

FIG. 1 is a schematic view of a film growth apparatus in the prior art. The film growth apparatus 10 includes a film growth reaction chamber 1 configured to epitaxialy grow various compound films or deposit various deposited products, such as a group III and group V element compound film, on a substrate 8a therein. In particular, as shown in FIG. 1, the reaction chamber 1 includes a side wall 12, a gas transportation apparatus 2 provided in the reaction chamber 1, and a substrate carrier 8. The gas transportation apparatus 2 includes a gas transportation surface 20 for releasing reaction gases into the reaction chamber 1. The reaction chamber 1 further includes a supporting apparatus 9 for supporting the substrate carrier 8. The supporting apparatus 9 is generally connected to a rotary driving apparatus 5a which may selectively drive the supporting apparatus 9 and the substrate carrier 8 to rotate. Preferably, the rotary driving apparatus 5a includes an electric motor. Optionally, the supporting apparatus 9 is further connected to an elevating driving apparatus 5b configured to adjust a height of the supporting apparatus 9 in the reaction chamber. Optionally, a substrate conveying opening 12a and a valve 12b for closing and opening the substrate conveying opening 12a may be provided on the side wall 12 of the reaction chamber 1, as needed. Before preparing the film growth process, a plurality of substrates 8a to be processed are preloaded onto the substrate carrier 8 outside the reaction chamber 1, and then the substrate carrier 8 loaded with the substrates is conveyed into the reaction chamber 1 from the outside of the reaction chamber 1 through the substrate conveying opening 12a manually or by a conveying robot, and is placed on the supporting apparatus 9 so as to perform the subsequent film growth process. After the film growth process is finished, the substrate carrier 8 loaded with the plurality of substrates 8a is conveyed to the outside of the reaction chamber 1 through the substrate conveying opening 12a and then the substrates 8a are unloaded from the substrate carrier 8.

Before performing the film growth process, the elevating driving apparatus 5b is actuated firstly to adjust the height of the supporting apparatus 9 in the reaction chamber 1 (in the direction indicated by the arrow 14b), such that the supporting apparatus 9 reaches a position corresponding to the substrate conveying opening 12a; then the valve 12a is shifted to open the substrate conveying opening 12a; the substrate carrier 8 preloaded with a plurality of substrates to be processed is conveyed into the reaction chamber 1 by an appropriate method and is placed on a supporting end 9a of the supporting apparatus 9; then the valve 12b is closed; and the elevating driving apparatus 5b is actuated to raise the height of the supporting apparatus 9 (along the reverse direction indicated by the arrow 14b) such that the substrate carrier 8 may have an appropriate distance from the gas transportation apparatus 2. Next, the rotary driving apparatus 5a is actuated to rotate the supporting apparatus 9, and then the supporting apparatus 9 drives the substrate carrier 8 to rotate together. The gas transportation apparatus 2 supplies reaction gas into the reaction chamber 1 via a gas transportation surface 20 thereof so as to grow film on the substrates 8a.

After the film growth process is performed in the reaction chamber 1 for a period of time, adhered aggregates, deposits or residues 22 may accumulated on the gas transportation surface 20 of the gas transportation apparatus 2. In the prior art, for cleaning the gas transportation apparatus 2, an operator has to open a top cover 13 of the reaction chamber after the temperature in the reaction chamber 1 is reduced to a certain temperature, and then remove the adhered aggregates, deposits or residues 22 from the gas transportation surface 20 manually.

Figure 2A:
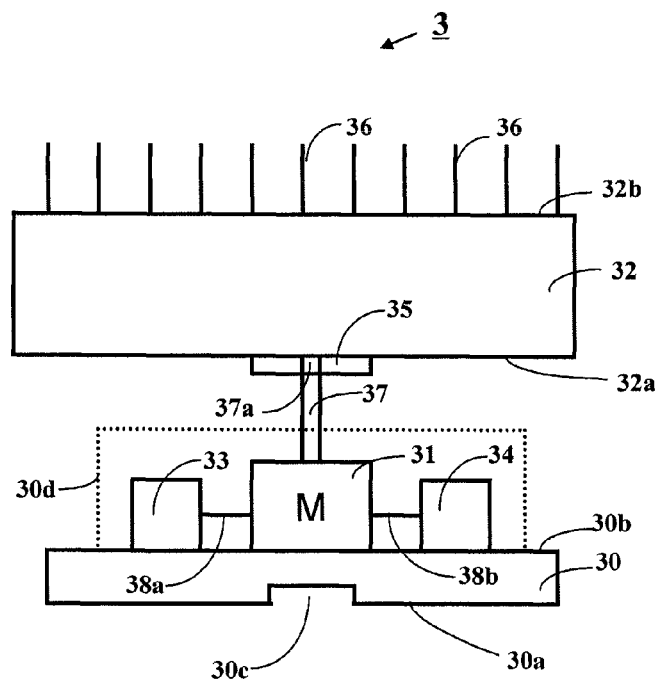
FIG. 2a is a schematic view of a cleaning apparatus according to an embodiment of the present application.
Figure 2B:
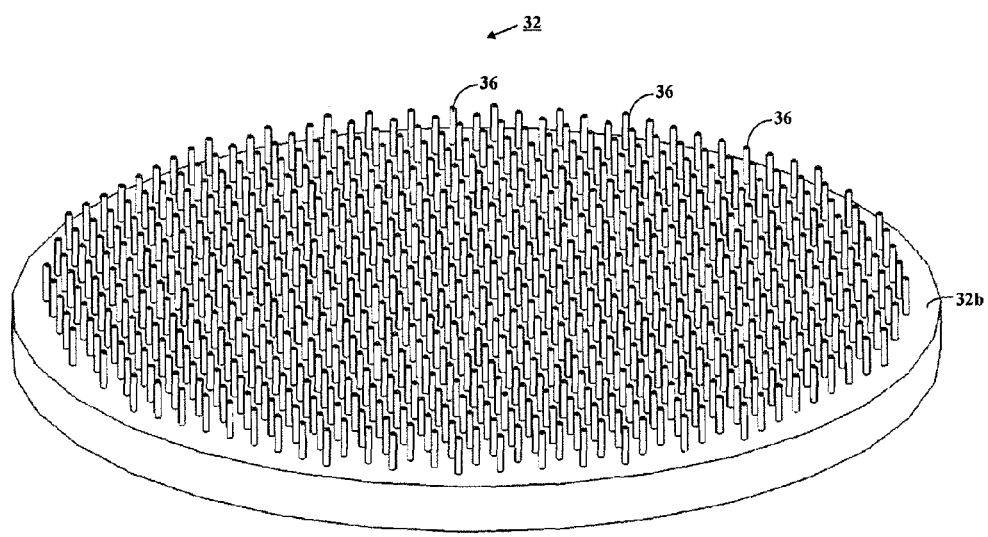
Figure 2C:
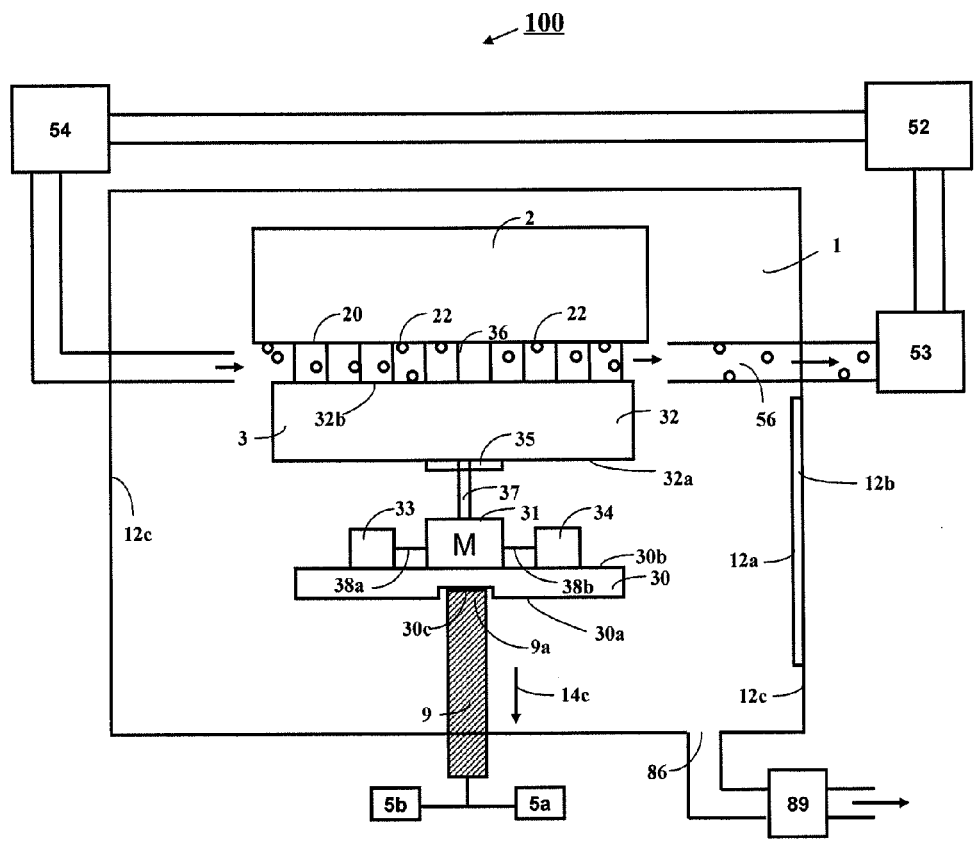
FIG. 2c is a schematic view of the working process of the cleaning apparatus as shown in FIGS. 2a and 2b for cleaning a gas transportation apparatus.
Figure 2D:
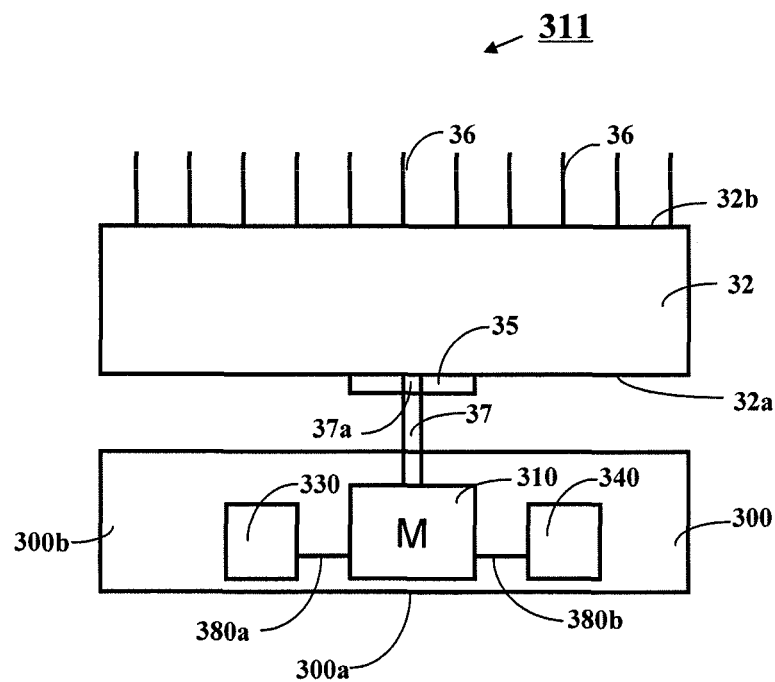
FIG. 2d is a schematic view of a cleaning apparatus according to another embodiment of the present application.

To clean the gas transportation apparatus effectively and automatically, the present application provides a cleaning apparatus 3 as shown in FIG. 2a. Referring to FIGS. 2a and 2b, FIG. 2a is a schematic view of a cleaning apparatus 3 according to an embodiment of the present application, and FIG. 2b is a perspective schematic view of a cleaning unit 32 of the cleaning apparatus 3 as shown in FIG. 2a. The cleaning apparatus 3 includes a supporting unit 30, a cleaning unit 32 and an electric motor 31. The electric motor 31 may be provided on the supporting unit 30, for example, on a top surface 30b of the supporting unit 30, or may be provided inside the supporting unit 30 as shown in FIG. 2d which will be described below. The electric motor 31 includes a driving shaft 37, one end 37a of which is connected to the cleaning unit 32. As an example of one connection method, a connecting component 35 is provided on a bottom surface 32a, and the end 37a of the driving shaft 37 is detachably or undetachably provided inside the connecting component 35. The driving shaft 37 drives the cleaning unit 32 to move together (for example, rising or falling, or rotating). On the one hand, the driving shaft 37 connects the cleaning unit 32 with the supporting unit 30; on the other hand, the driving shaft 37 also serves as a supporting rod for supporting the cleaning unit 32. The electric motor 31 is further connected to a power supply apparatus 33 via a cable 38a or in other connection means. The power supply apparatus may be a direct-current power supply or an alternating current power supply, or may be a battery, or may supply power via a cable from a remote position (for example, from the outside of the reaction chamber). It should be understood that, the power supply apparatus 33 may function as a part of the cleaning apparatus 3 as shown, and may also not be provided as a part of the cleaning apparatus 3. For example, the power supply apparatus 33 may be provided outside the reaction chamber 1, or may be provided on another component inside the reaction chamber 1, so as to supply power to the electric motor 31 via a cable. Optionally, the electric motor 31 may also be connected to a controller 34 via a cable 38b. The controller 34 is configured to control the electric motor 31 to start or stop. The controller 34 may be remotely controlled via a remote controller outside the reaction chamber 1, or may be controlled by a control software or an operation system provided on the reaction chamber 1. It should be understood that, the controller 34 may also be connected to the power supply apparatus 33 to control the start or the stop of the electric motor 31 by controlling the power supply. The cleaning unit 32 further includes a top surface 32b on which a plurality of scraping structures 36 are provided. As one example, the plurality of scraping structures 36 as shown in FIGS. 2a and 2b are a plurality of arrays of bristles. The bristles may be made of various relatively hard materials such as stainless steel, nylon, or relatively hard animal hairs. The supporting unit 30 further includes a bottom surface 30a acting as a supporting surface or a connecting surface. When the cleaning apparatus 3 is placed on the supporting apparatus 9 (as will be described in detail below) as shown in FIG. 2c, the bottom surface 30a of the supporting unit 30 may be placed on the supporting end 9a or a supporting surface (as will be described in detail below) of the supporting apparatus 9. The bottom surface 30a may be a flat surface, or may be provided with a connecting structure (as a concave portion 30c shown schematically) at an appropriate position (for example, a central area) for fitting or connecting with the supporting end 9a of the supporting apparatus 9 as shown. As shown, as one example, the electric motor 31, the power supply apparatus 33, the controller 34 and the cables 38a, 38b are all provided on the top surface 30b of the supporting unit 30. As needed, a cover casing 30d may be further provided, such that the power supply apparatus 33, the electric motor 31, the controller 34 and the cables 38a, 38b may be sealed inside the cover casing 30d.

As a preferred embodiment, the controller 34 may be controlled remotely. For example, when the cleaning apparatus 3 is placed on the supporting apparatus 9 inside the reaction chamber 1, a remote controller (not shown) outside the reaction chamber may be used to control the controller 34 so as to control the operation of the electric motor 31.

FIG. 2c is a schematic view of the working process of the cleaning apparatus as shown in FIGS. 2a and 2b for cleaning a gas transportation apparatus. It may be considered to some extent that the apparatus 100 as shown in FIG. 2c partially corresponds to the film growth apparatus as shown in FIG. 1. Thus, many components in FIG. 2c are the same as the components in FIG. 1. For the sake of conciseness, the components in FIG. 2c which are the same as the components in FIG. 1 are denoted by the same reference numbers in FIG. 1, which also applies to the other figures of the present application.

As described above, after the film growth process is performed for a period of time in the reaction chamber 1 in FIG. 1, the gas transportation apparatus 2 needs to be cleaned. Before performing the cleaning, the plurality of substrates 8a in FIG. 1 firstly need to be unloaded out of the reaction chamber 1 to avoid being contaminated, which may be realized by unloading the substrate carrier 8 loaded with the substrates 8a along the reverse direction of the arrow 14a as shown in FIG. 1 to the outside of the reaction chamber 1. In unloading substrate carrier, the substrate carrier 8 is detached from the supporting apparatus 9 and then moved out of the reaction chamber 1. Then, referring to FIG. 2c, the cleaning apparatus 3 as shown in FIG. 2a is provided into the reaction chamber 1 and is placed or mounted on the supporting apparatus 9 detachably, so as to prepare for performing the cleaning process to the gas transportation apparatus 2. After the cleaning process is finished, the cleaning apparatus 3 can also be easily detached from the supporting apparatus 9 and moved out of the reaction chamber 1. As one preferred embodiment, the apparatus 100 further includes a mechanical conveying apparatus T as shown in FIG. 1 (only a schematic view). The mechanical conveying apparatus T includes a conveying robot R. The conveying robot R of the mechanical conveying apparatus T may be used for performing some actions in automatic manner, for example, to convey the cleaning apparatus 3 and the substrate carrier 8 into or out of the reaction chamber 1, to mount the cleaning apparatus 3 and the substrate carrier 8 onto the supporting apparatus 9, and to detach the cleaning apparatus 3 and the substrate carrier 8 from the supporting apparatus 9. Then, the valve 12b of the substrate conveying opening 12a is closed. Optionally, the supporting apparatus 9 is connected to the elevating driving apparatus 5b for adjusting the height of the cleaning apparatus 3 in the reaction chamber 1 along the direction indicated by the arrow 14c or its reverse direction.

Next, the elevating driving apparatus 5b is actuated to adjust the height of the cleaning apparatus 3 in the reaction chamber 1 such that the scraping structures 36 may at least partially contact with the gas transportation surface 20 of the gas transportation apparatus 2. The electric motor 31 is started by the controller 34 so as to rotate the driving shaft 37, in turn drives the cleaning unit 32 to rotate, thereby driving the scraping structures 36 of the cleaning apparatus 3 to rotate. The scraping structures 36 at least partially contacting with the gas transportation surface 20 of the gas transportation apparatus 2 remove the adhered aggregates 22 adhered to the gas transportation surface 20. A suction port 56 is provided adjacent to the scraping structures 36 and is connected to an air exhaust apparatus (such as an air exhaust pump or a blower) 54. The air exhaust apparatus 54 keeps working to form a suction function, so as to suck the removed adhered aggregates 22 from a position closer to the scraping structures 36 through the suction port 56.

As an exemplary embodiment, an apparatus for realizing the suction process is provided as schematically shown in FIG. 2c. The suction port 56 is provided adjacent to the scraping structures 36. For example, the suction port 56 may be located in a horizontal space formed between the gas transportation surface 20 and the top surface 32b of the cleaning unit 32. The suction port 56 is directly or indirectly connected to or in fluid communication with an aggregate collecting apparatus 53 configured to collect the removed adhered aggregates 22. A filter (not shown) may be further provided inside the aggregate collecting apparatus 53. In this way, the suction air flow may enter into the air exhaust apparatus 54 after passing through the filter of the aggregate collecting apparatus 53, thereby forming a flow path of the suction air. Optionally, a cooling apparatus 52 may be further provided between the aggregate collecting apparatus 53 and the air exhaust apparatus 54 to cool the high-temperature air passed through the aggregate collecting apparatus 53, so as to protect the air exhaust apparatus 54 from being damaged by overheating.

In FIG. 2c, during the cleaning process of the gas transportation apparatus 2, for improving the cleaning efficiency and preventing the adhered aggregates 22 from entering into gas transportation holes of the gas transportation apparatus 2, inert gases or other gases (such as $H_2$) may be blown into the reaction chamber 1 via the gas transportation apparatus 2 to blow the adhered aggregates 22 into the horizontal space between the gas transportation surface 20 and the surface 32b.

It should be understood that, the suction port 56 may be arranged at another position as actually needed, as long as the suction port is provided so as to be in fluid communication with the inside of the reaction chamber. For example, the suction port may also be provided at a bottom portion or a side wall of the reaction chamber 1. For example, the suction port 56 may also be configured as a suction port 86 provided as shown in the figure. The suction port 86 is connected to an air exhaust apparatus 89. The suction port 86 and the air exhaust apparatus 89 are practically provided in the reaction chamber 1 to make the reaction chamber 1 form a vacuum reaction chamber.

It should be understood that, the power supply apparatus 33 and the electric motor 31 and so on may also be provided inside the supporting unit wholly, or be partially embedded in the supporting unit. Referring to FIG. 2d, FIG. 2d is a schematic view of a cleaning apparatus according to another embodiment of the present application. The difference between the cleaning apparatus 311 in FIG. 2d and the cleaning apparatus 3 in FIG. 2a lies in different settings of the supporting unit. The cleaning apparatus 311 includes a supporting unit 300 which includes a bottom surface 300a acting as a supporting surface or a connecting surface. The supporting unit 300 includes a hollow cavity 300b. A power supply apparatus 330, an electric motor 310, a controller 340 and cables 380b, 380a, etc. are wholly or partially placed inside the supporting unit 300 (for example, inside the cavity 300b). The driving shaft 37 of the electric motor 310 extends out from the inside of the supporting unit 300 and is connected to the cleaning unit 32.

Figure 3A:
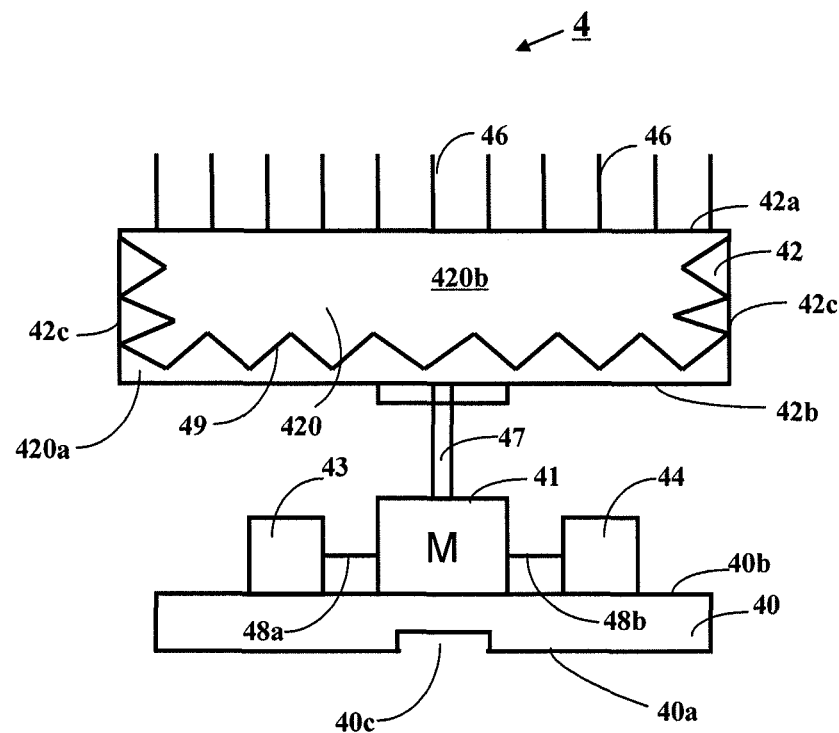
FIG. 3a is a schematic view of a cleaning apparatus according to another embodiment of the present application.
Figure 3B:
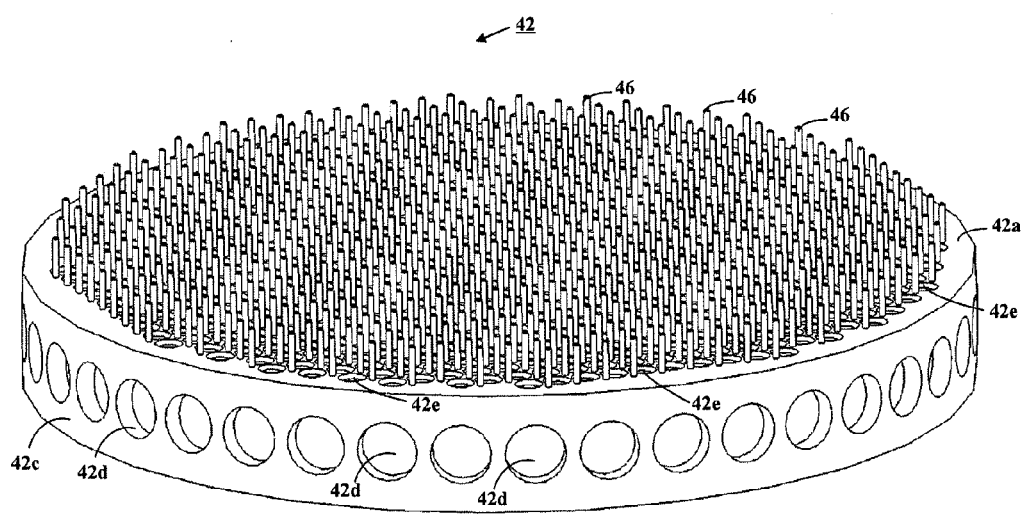

FIG. 3a shows a cleaning apparatus according to another embodiment; and FIG. 3b is a perspective schematic view of a cleaning unit of the cleaning apparatus as shown in FIG. 3a. The main difference between the cleaning apparatus 4 as shown in FIG. 3a and the cleaning apparatus 3 as shown in FIG. 2a lies in different cleaning units.

Figure 3C:
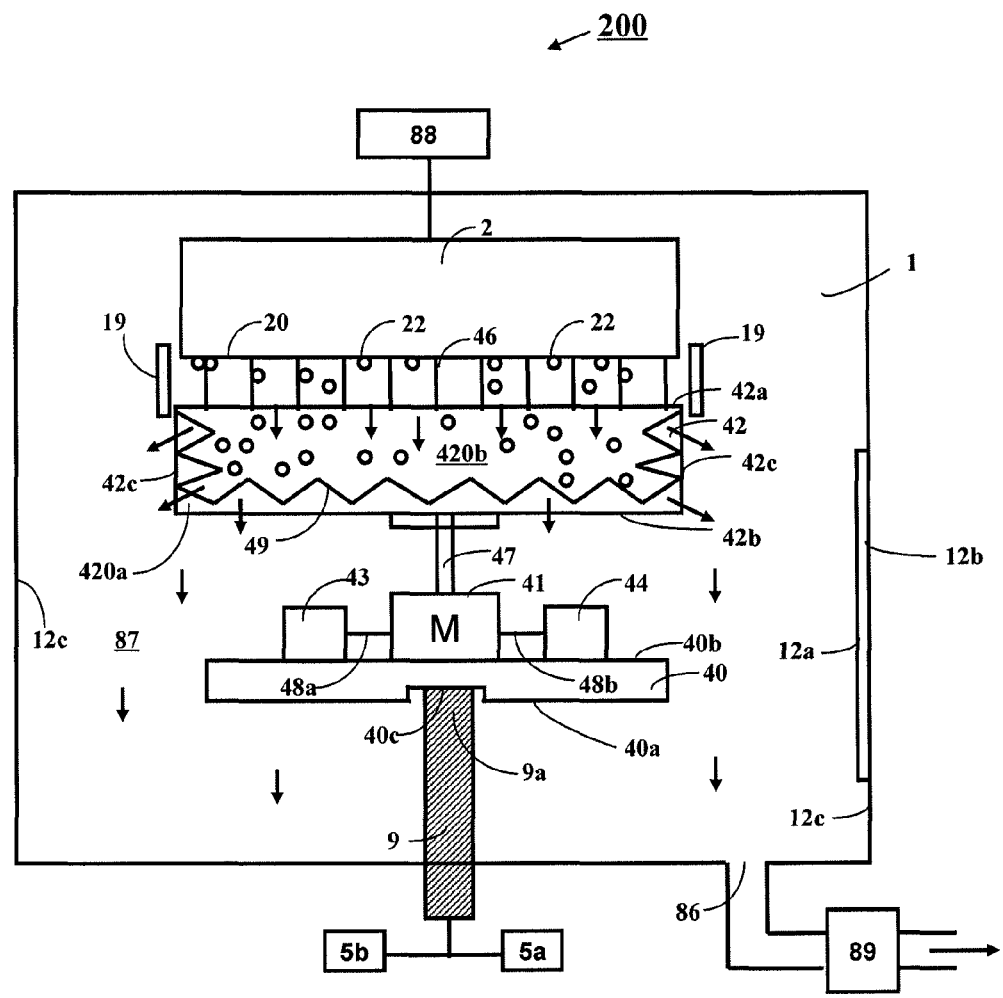
FIG. 3c is a schematic view of the working process of the cleaning apparatus as shown in FIGS. 3a and 3b for cleaning a gas transportation apparatus.

The cleaning apparatus 4 includes a supporting unit 40, a cleaning unit 42 and an electric motor 41 provided on the supporting unit 40. The electric motor 41 includes a driving shaft 47, one end of which is connected to the cleaning unit 42. The driving shaft 47 connects the cleaning unit 42 with the supporting unit 40 and also acts as a supporting rod for supporting the cleaning unit 42. The electric motor 41 is connected to a power supply apparatus 43 via a cable 48a. Optionally, the electric motor 41 is connected to a controller 44 via a cable 48b. The supporting unit 40 further includes a bottom surface 40a acting as a supporting surface or a connecting surface. When the cleaning apparatus 4 is placed on the supporting apparatus 9 as shown in FIG. 3c, the bottom surface 40a of the supporting unit 40 may be placed on the supporting end 9a or the supporting surface (as will be described in detail below) of the supporting apparatus 9. The bottom surface 40a may be a flat surface, or may be provided with a connecting structure (as a concave portion 40c shown schematically) at an appropriate position (for example, a central area) for fitting or connecting with the supporting end 9a of the supporting apparatus 9 as shown.

The cleaning unit 42 as shown in FIG. 3a includes a first connecting plate 42a, a second connecting plate 42b and a connecting structure (as a side wall shown schematically) 42c connecting the two connecting plates. The first connecting plate 42a is provided substantially parallel to the second connecting plate 42b, with a hollow space 420 being formed therebetween. An aggregate collecting apparatus 49 is provided inside the space 420. A plurality of scraping structures 46 is provided on a top surface of the first connecting plate 42a. The first connecting plate 42a further includes a plurality of passages 42e (referring to FIG. 3b) passing through upper and bottom surfaces of the first connecting plate 42a. Each passage 42e is a kind of passage structure allowing the adhered aggregates 22 and gases to pass through. The aggregate collecting apparatus 49 and at least a part of the first connecting plate 42a form an aggregate collecting cavity 420b which is in fluid communication with the plurality of passages 42e of the first connecting plate 42a. The aggregate collecting apparatus 49 is provided with a plurality of small aggregate filtering holes (not shown) through which the adhered aggregates 22 removed from the surface 20 of the gas transportation apparatus 2 can be collected and saved in the aggregate collecting cavity 420b and filtered clean gas can be allowed to enter into an air exhaust area 420a located below the aggregate filtering apparatus 49. The air exhaust area 420a as shown is formed by the second connecting plate 42b and a part of the connecting structure 42c. A plurality of gas passages 42d are provided in the second connecting plate 42b and/or the connecting structure 42c and enable the air exhaust area 420a to be in fluid communication with the air exhaust area 87 (FIG. 3c) inside the reaction chamber 1. A suction port 86 is provided in the bottom portion or the side wall of the reaction chamber 1 such as to be in fluid communication with the inside of the reaction chamber 1, and is connected to an air exhaust apparatus 89 (for example, an air exhaust pump or a blower).

FIG. 3c is a schematic view of the working process of the cleaning apparatus as shown in FIGS. 3a and 3b for cleaning a gas transportation apparatus. Similar to the above description, the cleaning apparatus 4 is firstly moved into the reaction chamber 1 from the outside of the reaction chamber 1 by the conveying robot R of the mechanical conveying apparatus T or by other means, and is detachably placed on the supporting end 9a of the supporting apparatus 9. The position of the supporting apparatus 9 is adjusted such that at least a part of the scraping structures 46 of the cleaning apparatus 4 contacts with the gas transportation surface 20 of the gas transportation apparatus 2. By starting the controller 44, the driving shaft 47 of the electric motor 41 drives the cleaning unit 42 to rotate, and the scraping structures 46 driven by the cleaning unit 42 rotate and remove the adhered aggregates 22 adhered to the gas transportation surface 20. During the cleaning process of the gas transportation apparatus 2, the gas transportation apparatus 2 may be selectively connected to a gas source 88 for feeding or blowing gas into the reaction chamber 1 during the cleaning process. At the same time, the air exhaust apparatus 89 is working, so that under the suction of the air exhaust apparatus 89 of the reaction chamber 1, the removed adhered aggregates 22 is sucked into the aggregate collecting cavity 420b through the plurality of passages 42e of the first connecting plate 42a along a downward arrow as shown. Due to the filtration of the aggregate collecting apparatus 49, the adhered aggregates 22 may be accumulated and collected inside the aggregate collecting cavity 420b, and the filtered clean gas may enter into the air exhaust area 420a again, enter into the area 87 inside the reaction chamber 1 through the gas passages 42d, and finally is expelled to the outside of the reaction chamber 1 by the air exhaust apparatus 89. During the above process, the gas transportation apparatus 2, the aggregate collecting cavity 420b, the air exhaust area 420a, the area 87, the suction port 86 and the air exhaust apparatus 89 are all in fluid communication with each other and form a gas flowing route. After the cleaning process is finished, the rotation of the electric motor 41 is stopped by the controller 44, and then the whole cleaning apparatus 4 is conveyed to the outside of the reaction chamber 1 by the conveying robot R.

The above said aggregate collecting apparatus 49 may be embodied in various forms. A preferred embodiment is a filtering screen with fine and close filtering holes. The aggregate collecting apparatus 49 may be fixedly connected to the connecting structure 42c or the first connecting plate 42a, or may be detachably mounted on the connecting structure 42c or the first connecting plate 42a. After the cleaning process is performed for a period of time, the aggregate collecting apparatus 49 may be demounted and replaced by a new aggregate collecting apparatus 49 for the next cleaning process.

Further, optionally, a barrier apparatus 19 may be provided adjacent to the peripheral of the plurality of scraping structures 46. The barrier apparatus 19 is provided adjacent to the peripheral of the gas transportation apparatus 2 inside the reaction chamber 1 and encircles the plurality of scraping structures 46, thereby forming a barrier apparatus to prevent the adhered aggregates 22 removed from the gas transportation apparatus 2 from escaping to the outside of the barrier apparatus 19 along with the airflow. As an embodiment, the barrier apparatus 19 may be provided such that it is movable up and down. During the film growth process, the barrier apparatus 19 may be retracted to the peripheral of the gas transportation apparatus 2, so as not to affect the film growth process; and during the cleaning process, the barrier apparatus 19 may extend by a certain distance downwardly from the peripheral of the gas transportation apparatus 2, so as to provide different degrees of barrier effect according to the requirements of the cleaning process. In addition, as another embodiment, the barrier apparatus 19 may also be a part of the cleaning apparatus 4 and is provided on a top surface of the first connecting plate 42a of the cleaning unit 42 at a peripheral area of the plurality of scraping structures 46. As a preferred embodiment, the barrier apparatus 19 is of an annular structure.

It should be understood that, the above said passages 42e may also be varied into any other passage structures which may allow the adhered aggregates 22 and gases to pass through, such as various hollow structures, or grooves, or slots, or a combination of grooves and holes. Further, the locations of grooves or holes may be various according to the practical requirements, for example, lengthwise grooves, annular grooves or annular holes. Similarly, the above said gas passages 42d may also be varied into any other passage structures which may allow gases to pass through, such as various hollow structures, or grooves, or slots, or a combination of grooves and holes.

The above said supporting apparatus 9 in the reaction chamber may also be implemented in various forms, as long as it can support the supporting unit of the cleaning apparatus. The supporting apparatus 9 formed by a supporting shaft is provided as shown in FIGS. 2c and 3c, and may also act as a supporting apparatus for the substrate carrier 8 in FIG. 1. The supporting apparatus 9 supports and rotates the substrate carrier 8 during the substrate treatment process. The supporting apparatus 9 includes the supporting end 9a, and accordingly, a connecting structure (the concave portion 30c or 40c shown schematically) is provided on the supporting unit 30 of the cleaning apparatus 3 or 4. When the cleaning apparatus 3 or 4 is placed on the supporting apparatus 9, and the supporting end 9a is received in the concave portion 30c or 40c such that the cleaning apparatus is detachably placed on the supporting apparatus 9.

Figure 4A:
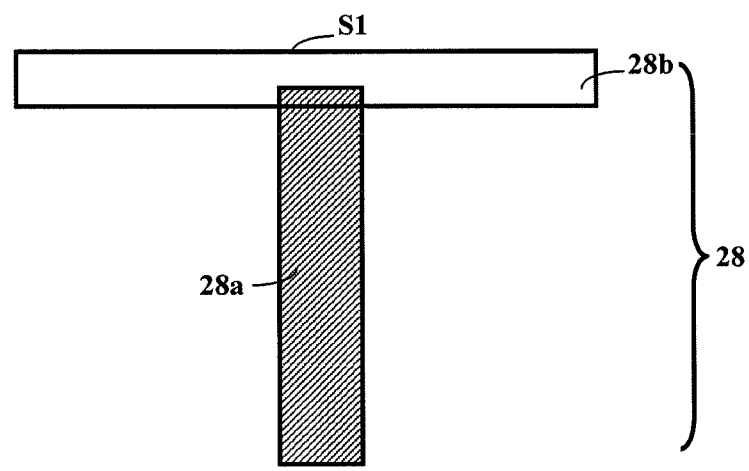
FIGS. 4a and 4b are schematic views of two embodiments of a supporting apparatus.
Figure 4B:
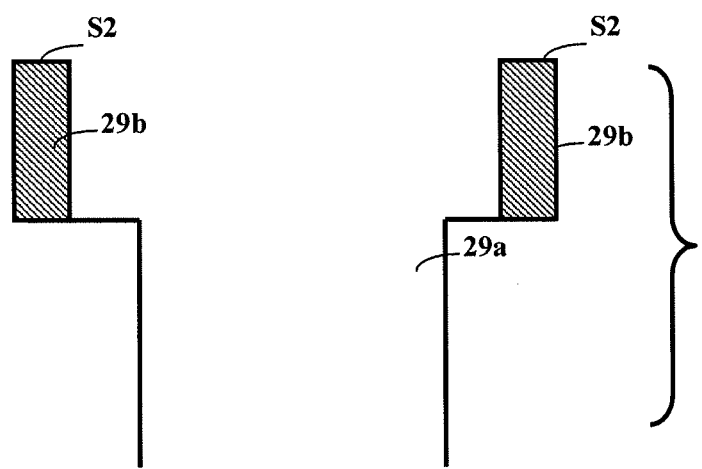

FIGS. 4a and 4b show two other embodiments of a supporting apparatus. A supporting apparatus 28 as shown in FIG. 4a includes a first supporting member 28a and a second supporting member 28b connected to the first supporting member 28a. The first supporting member 28a and the second supporting member 28b are connected to each other so as to move together (for example, rising or falling, or rotating). The second supporting member 28b includes a supporting surface or a supporting end S1 on which the above cleaning apparatus is placed directly and detachably. Similarly, the cleaning apparatus 3 or 4 is detachably placed on the supporting surface or the supporting end S1 of the second supporting member 28b of the supporting apparatus 28, and maintains in contact with the supporting surface or the supporting end S1 at least during the cleaning process. After the cleaning process is finished, the cleaning apparatus 3 or 4 may also be easily detached from the second supporting member 28b to be moved to the outside of the reaction chamber 1. Preferably, the first supporting member 28a is a rotation shaft or a supporting rod, and the second supporting member 28b is a supporting tray and may be made of stainless steel material, aluminum material or quartz material.

A supporting apparatus 29 as shown in FIG. 4b includes a first supporting member 29a and a second supporting member 29b provided above the first supporting member 29a. The second supporting member 29b is connected to the first supporting member 29a and may move together with the first supporting member 29a. The second supporting member 29b includes a supporting surface or a supporting end S2, the above cleaning apparatus is detachably placed on the supporting surface or the supporting end S2 directly. Preferably, the first supporting member 29a is a rotation shaft or a supporting rod, and the second supporting member 29b is an annular supporting member and may be made of quartz or stainless steel.

It should be understood that, the supporting apparatus may also be embodied in other forms. As another embodiment, the supporting apparatus is a component having supporting function and provided on other components inside the reaction chamber 1. For example, a bracket structure is provided on an inner side wall 12c of the reaction chamber 1 to act as a supporting apparatus. As still another embodiment, the supporting apparatus may also be a structure temporarily extending into the reaction chamber 1 from the outside of the reaction chamber 1 to perform supporting function. For example, the above conveying robot may also act as a supporting apparatus, or any structure extending into the reaction chamber 1 through the substrate conveying opening 12a or a part at which the reaction chamber top cover is opened so as to provide supporting function may act as a supporting apparatus.

Figure 5:
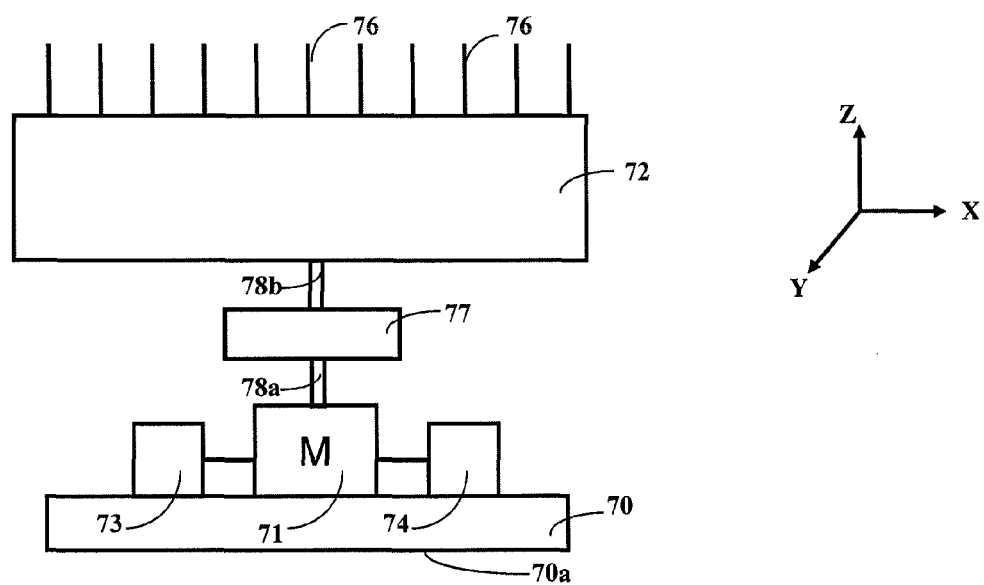
FIG. 5 is a schematic view of a cleaning apparatus according to another embodiment of the present application.

FIG. 5 is a schematic view of a cleaning apparatus according to another embodiment of the present application. The difference between a cleaning apparatus 7 in this embodiment and the cleaning apparatus in the above various embodiments is that the cleaning apparatus 7 further includes a motion converting mechanism 77 provided between a driving shaft 78a of an electric motor 71 and a cleaning unit 72. Optionally, a connecting rod 78b is further provided between the cleaning unit 72 and the motion converting mechanism 77. One end of the connecting rod 78b is connected to the cleaning unit 72 and the other end thereof is connected to the motion converting mechanism 77. Optionally, the connecting rod 78b may be designed as a part of the motion converting mechanism 77, that is, the motion converting mechanism 77 is directly connected to the cleaning unit 72. The motion converting mechanism 77 functions to convert the rotation motion provided by the electric motor 71 into other motions, for example, a linear motion, a linear reciprocating motion, a curve reciprocating motion, a rotation motion not rotating around a fixed center, an elliptical motion, a swing motion, a vibration motion and other complex motions. The linear motion may include a unidirectional translational motion and a reciprocating translational motion. Those other motions converted by the motion converting mechanism 77 may be transmitted to the cleaning unit 72 via the connecting rod 78b, so as to drive the cleaning unit 72 to make the same motion. It should be understood that, the other motions of the cleaning unit 72 include any possible motions in a space defined by an X axis, a Y axis and a Z axis as shown, for example, a linear motion or a reciprocating motion along a direction of the X axis, a linear motion or a reciprocating motion along a direction of the Z axis. It is particularly noted that, the motion converting mechanism 77 may provide rising and falling motion in the vertical direction for the cleaning unit 72. Thus, the height of the cleaning unit 72 in the reaction chamber 1 in the vertical direction may be adjusted by the motion converting mechanism 77 provided on the cleaning apparatus 7. With this configuration, it is possible to clean an inner side wall of the reaction chamber or remove the adhered aggregates adhered to the side wall by the cleaning apparatus of the present application. The detailed configuration of the motion converting mechanism 77 may be embodied in various forms according to the practical requirements, and may be various mechanical transmission structures or transmission apparatus commonly used in the prior art, for example, a structure formed by a gear, a transmission shaft, an eccentric shaft, a push rod, a worm gear, a worm and a connecting rod mechanism and so on, or a combination of the mechanical transmission structure and a software control. These transmission structures are widely used in the vehicle industry and the commodity industry, and may also be used in the motion converting mechanism 77 of the present application, which will not be described in detail herein. Similarly, the cleaning apparatus 7 further includes a supporting unit 70, an electric motor 71, a power supply apparatus 73 and a controller 74 (optional). The supporting unit 70 includes a bottom surface 70a acting as a supporting surface or a connecting surface. A plurality of scraping structures 76 is provided on the cleaning unit 72.

Figure 6:
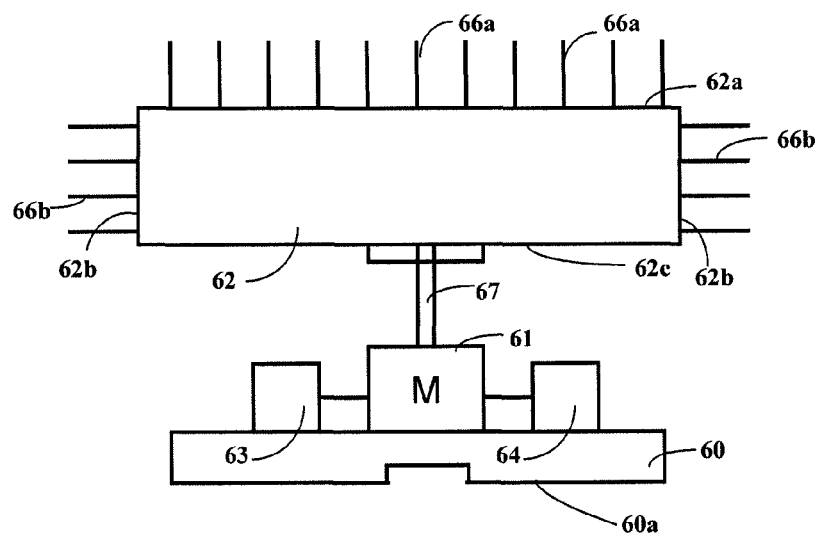
FIG. 6 is a schematic view of a cleaning apparatus according to another embodiment of the present application.

According to the essence and the spirit of the present application, the above cleaning apparatus may be further broadened and varied to provide another cleaning apparatus for removing the adhered aggregates on the inner surface of the film growth reaction chamber. FIG. 6 is a schematic view of a cleaning apparatus according to another embodiment of the present application. The cleaning apparatus 6 as shown in FIG. 6 is generally similar to the above various embodiments, except that the range and area of the scraping structures on the cleaning unit is broadened so as to remove adhered aggregates on other surfaces of the reaction chamber besides the gas transportation surface 20. Also referring to FIG. 2c, the apparatus 100 in FIG. 2c includes the film growth reaction chamber 1. After the film growth process is performed for a period of time, some adhered aggregates 22 may be deposited or adhered onto the inner surface of the reaction chamber 1. The inner surface of the reaction chamber 1 refers to the outer surfaces of any components exposed in the film growth process environment inside the reaction chamber 1, including but not limited to, the gas transportation surface 20 of the gas transportation apparatus 2, the inner side wall 12c of the reaction chamber 1, and an outer surface of a heating element (not shown) provided below the substrate carrier, etc. As an embodiment, the cleaning apparatus 6 includes a cleaning unit 62 having several surfaces facing the inner surface of the reaction chamber 1. For example, as schematically shown, the cleaning unit 62 at least includes a first surface 62a, a second surface 62b and a third surface 62c. The first surface 62a is provided such as to face and be parallel to the gas transportation surface 20 of the gas transportation apparatus 2, the second surface 62b faces the inner side wall 12c of the reaction chamber 1 and the third surface 62c faces the outer surface of the heating element (not shown). A plurality of scraping structures 66a and 66b are provided on the first surface 62a and the second surface 62b. A plurality of scraping structures may also be provided on the third surface 62c according to the practical requirements. Similarly, the cleaning apparatus 6 further includes a supporting unit 60, an electric motor 61, a power supply apparatus 63 and a controller 64 (optional). The supporting unit 60 includes a bottom surface 60a acting as a supporting surface or a connecting surface.

When the cleaning apparatus 6 is used to clean the adhered aggregates on the inner surface of the reaction chamber 1, the cleaning apparatus 6 is firstly conveyed to the inside of the reaction chamber 1 from the outside of the reaction chamber 1, and the bottom surface 60a of the supporting unit 60 is placed on the supporting apparatus 9 inside the reaction chamber. As needed, the scraping structures 66a and 66b may contact with the inner surfaces 20 and 12c of the reaction chamber by adjusting the position of the cleaning unit 62 of the cleaning apparatus 6. The electric motor 61 is started to drive the driving shaft 67 to rotate, and the driving shaft 67 drives the cleaning unit 62 to rotate. The scraping structures 66a and 66b contact with the gas transportation surface 20 and the inner side wall 12c of the reaction chamber 1 at the same time, and remove the adhered aggregates 22 adhered to the inner surfaces 20 and 12c of the reaction chamber. The removed adhered aggregates 22 are collected through a suction port by an air exhaust apparatus, or are discharged to the outside of the reaction chamber 1. Selectively, during the cleaning process, a vertical height of the cleaning unit 62 inside the reaction chamber 1 is adjusted while the cleaning unit 62 is rotating, such that the scraping structure 66b of the cleaning apparatus 6 may move up and down along the side wall 12c and contact with the side wall 12c so as to remove all the adhered aggregates on the side wall 12c.

Figure 7:
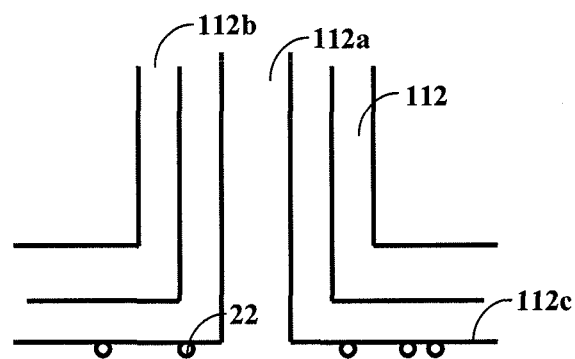
FIG. 7 is a schematic view of an injector-type gas dispersing apparatus.

It should be understood that, the above mentioned gas transportation apparatus may be of any type. For example, the gas transportation apparatuses 2 described above as shown are all a gas distribution showerhead apparatus having a generally flat gas transportation surface 20, with multiple small gas distribution holes being provided in the gas transportation apparatuses 2 closely. The gas transportation apparatuses 2 according to the present application may also be an injector-type gas dispersing apparatus. As shown in FIG. 7, FIG. 7 is a schematic view of an injector-type gas dispersing apparatus. An injector-type gas dispersing apparatus 112 includes a plurality of gas injection passages 112a and 112b for transporting various reaction gases. The injector-type gas dispersing apparatus 112 further includes a gas transportation surface 112c to which adhered aggregates 22 is adhered. It should be understood that, the gas transportation apparatus in the present application may be a combination of the gas distribution showerhead apparatus and the injector-type gas dispersing apparatus.

Figure 8:
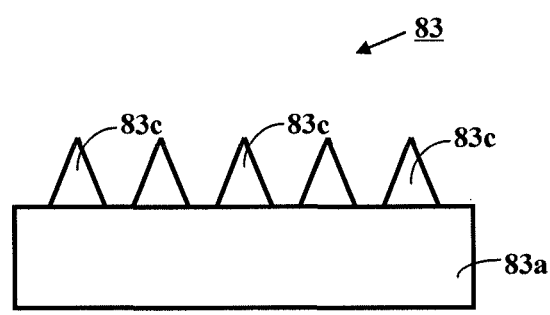
FIG. 8 is a schematic view of another embodiment of a scraping structure of the cleaning unit.

FIG. 8 is a schematic view of another embodiment of a scraping structure on the cleaning unit. The above scraping structure may also be varied into a ridged scraping blade structure 83c as shown in FIG. 8. FIG. 8 only shows a cleaning unit 83 provided with a plurality of ridged scraping blade structure 83c. Certainly, the scraping structure on the cleaning unit 83 may also include both the ridged scraping blade structures and the bristle structures.

Optionally, in the reaction chamber 1 of the above various embodiments, a rotary driving apparatus 5a may be further provided, and is connected to the supporting apparatus 9, and may selectively drive the supporting apparatus 9 and the cleaning apparatus to rotate together.

Preferably, during the process of the above methods, the reaction chamber cover of the reaction chamber remains in closed state. That is, the cleaning apparatus of the present application may be used to complete the process of cleaning the inner wall of the reaction chamber automatically, not manually.

The dimension and the size of the cleaning apparatus of the present application may be designed and adjusted as desired. In a preferred embodiment, the cleaning apparatus is designed as a dummy of a substrate carrier. That is, the dimension, size and shape of the cleaning apparatus are designed to be approximate or identical to the dimension, size and shape of the substrate carrier 8 in FIG. 1, such that the cleaning apparatus and the substrate carrier 8 may use a common supporting apparatus 9. For example, the supporting unit 30 of the cleaning apparatus 3 in FIG. 2a may be designed to have the same shape (being cylindrical) and the same diameter as the substrate carrier 8, and further the connecting surface 30a of the supporting unit 30 may be designed to be identical with the connecting surface 8b of the substrate carrier 8. Optionally, the cleaning unit 32 of the cleaning apparatus 3 may also be designed to be cylindrical and have a diameter approximate or identical to the substrate carrier 8. In this way, after the film growth process is performed for a period of time, the film growth process is stopped, and without opening the chamber cover of the reaction chamber 1, the conveying robot R of the mechanical conveying apparatus T may directly detach the substrate carrier 8 from the supporting apparatus 9, and move the substrate carrier 8 to the outside of the reaction chamber 1, and then mount the cleaning apparatus 3 having a similar or identical structure as the substrate carrier 8 to perform the process of cleaning the gas transportation apparatus 2. Unlike the prior art, the complete cleaning process does not need to open the reaction chamber cover, and does not need the manual operation. Thus, the complete cleaning process may be automatically accomplished by a device or a system. Since the reaction chamber cover of the reaction chamber remains in closed state, there is no need to wait for performing the cleaning process until the temperature in the reaction chamber 1 is decreased to a certain temperature.

Based on the above essence and spirit of the present application, the present application further provides a method for removing adhered aggregates on the inner surface of the film growth reaction chamber, wherein a supporting apparatus is provided in the reaction chamber, and the method comprises:

a) providing a cleaning apparatus into the reaction chamber and placing the cleaning apparatus on the supporting apparatus detachably, wherein the cleaning apparatus includes a supporting unit, a cleaning unit and an electric motor, and the cleaning unit includes a surface facing an inner surface of the reaction chamber and provided with a plurality of scraping structures thereon; and b) adjusting a position of the cleaning apparatus such that the scraping structures may at least partially contact with the inner surface of the reaction chamber, and starting the electric motor to drive the cleaning unit to make relative motion along the inner surface of the reaction chamber, such that the scraping structures contact with the inner surface of the reaction chamber and remove the adhered aggregates adhered to the inner surface of the reaction chamber.

The method further includes the steps of: providing a suction port in fluid communication with the inside of the reaction chamber, wherein the suction port is connected to an air exhaust pump or a blower; and operating the air exhaust pump or the blower to perform a suction function.

The method further includes the step of providing an aggregate collecting apparatus in fluid communication with the suction port to collect the adhered aggregates.

The aggregate collecting apparatus in fluid communication with the suction port is provided inside the cleaning apparatus to collect the adhered aggregates.

The method further includes the step of providing a mechanical conveying apparatus located outside the reaction chamber, wherein the mechanical conveying apparatus includes a conveying robot, and the conveying robot may selectively convey the cleaning apparatus into the reaction chamber from the outside of the reaction chamber and place the cleaning apparatus on the supporting apparatus, or remove the cleaning apparatus from the supporting apparatus and convey the cleaning apparatus to the outside of the reaction chamber.

Step b) further includes the step of blowing inert gases or $H_2$ into the reaction chamber via a gas transportation surface of a gas transportation apparatus.

The cleaning apparatus further includes a motion converting mechanism provided between a driving shaft of the electric motor and the cleaning unit and configured to convert the rotation motion of the electric motor into other motions and to drive the cleaning unit to make the other motions.

In step a), the cleaning apparatus is placed on the supporting apparatus in the reaction chamber by a conveying robot or by manual operation of an operator.

Based on the essence and spirit of the present application, the present application further provides a method for film growth in a reaction chamber, wherein a supporting apparatus having a supporting end or a supporting surface is provided in the reaction chamber, and the method comprises:

a) providing a substrate carrier on which one or a plurality of substrates to be processed is loaded;

b) moving the substrate carrier into the reaction chamber and placing the substrate carrier on the supporting end or the supporting surface of the supporting apparatus detachably;

c) releasing reaction gases into the reaction chamber through a gas transportation apparatus and rotating the supporting apparatus and the substrate carrier to grow the film on the substrate;

d) stopping step c), detaching the substrate carrier from the supporting end or the supporting surface of the supporting apparatus and moving the substrate carrier out of the reaction chamber;

e) providing a cleaning apparatus into the reaction chamber, placing the cleaning apparatus on the supporting apparatus detachably, wherein the cleaning apparatus includes a supporting unit, a cleaning unit and an electric motor, and the cleaning unit includes a surface facing an inner surface of the reaction chamber and provided with a plurality of scraping structures;

f) adjusting a position of the cleaning apparatus such that the scraping structures may at least partially contact with the inner surface of the reaction chamber, and starting the electric motor to drive the cleaning unit to make relative motion along the inner surface of the reaction chamber, such that the scraping structures contact with the inner surface of the reaction chamber and remove the adhered aggregates adhered to the inner surface of the reaction chamber; and g) stopping step f), detaching the cleaning apparatus from the supporting end or the supporting surface of the supporting apparatus and moving the cleaning apparatus out of the reaction chamber.

Step f) further includes the step of providing a suction port in fluid communication with the inside of the reaction chamber, wherein the suction port is connected to an air exhaust pump or a blower, and operating the air exhaust pump or the blower to perform a suction function.

Step f) further includes the step of providing an aggregate collecting apparatus in fluid communication with the suction port to collect the adhered aggregates.

The cleaning apparatus further includes a motion converting mechanism provided between a driving shaft of the electric motor and the cleaning unit and configured to convert the rotation motion of the electric motor into other motions and to drive the cleaning unit to make the other motions.

In step e), the cleaning apparatus is placed on the supporting apparatus in the reaction chamber by a conveying robot or by manual operation of an operator.

In step g), the cleaning apparatus is detached from the supporting apparatus and moved out of the reaction chamber by a conveying robot or by manual operation of an operator.

In the present application, the mechanical conveying apparatus T as shown is only illustrative, and may be a substrate transfer chamber connected to the reaction chamber 1. The above conveying robot may be provided inside the substrate transfer chamber. Apparently, the mechanical conveying apparatus T may also be configured in other forms, for example, a single robot conveying apparatus.

The reaction chamber 1 in the above various apparatuses may be various types of reaction chamber, including but not limited to, a vertical reaction chamber, a horizontal reaction chamber, a planetary reaction chamber, a vertical spray-type reaction chamber and a high-speed rotary disc reaction chamber.

The apparatus and method provided by the present application are applicable to any film growth processes, including but not limited to, an MOCVD process and an HYPE process for growing epitaxial layer on the substrate, e.g., for group III and group V element compound film growth.

It should be understood that, in the above various embodiments, the cleaning apparatus is transferred into and out of the reaction chamber preferably by a conveying robot. However, in order to save the cost of the producer, the cleaning apparatus may be directly transferred by an operator manually, rather than by the mechanical transferring method. For example, before cleaning the adhered aggregates on the inner surface of the reaction chamber, the operator firstly opens the top cover of the reaction chamber, places the cleaning apparatus on the supporting apparatus manually, and then closes the top cover of the reaction chamber; and then the cleaning apparatus may be started to perform the cleaning process. After the cleaning process is finished, the operator opens the top cover of the reaction chamber again, and removes the cleaning apparatus out of the reaction chamber manually. The operator may also transfer the cleaning apparatus manually through the substrate conveying opening 12a.

It should be understood that, the "reaction gas" mentioned in the present application is not limited to one kind of gas, but also includes a mixed gas of various gases.

Compared with the prior art, the cleaning apparatus, the reaction apparatus, the cleaning method and the film growth method provided by the present application have some advantages. For example, the whole process for cleaning or removing the adhered aggregates on the inner surface of the film growth reaction chamber may be performed without the need of opening the reaction chamber cover, and thus it is an in-situ cleaning method. The whole process may be realized automatically. Furthermore, the cleaning method is simple, convenient, and may ensure the quality and consistency of cleaning process so as to avoid having adverse effects on the subsequent film growth. In general, the producer's cost is greatly reduced and the effective processing uptime of the whole film growth apparatus is greatly improved.

The various embodiments of the present application are described in detail hereinabove. It should be noted that, the above embodiments are only illustrative, and are not limit the present application. Any technical solution, without departing from the spirit of the present application, is deemed to fall into the protection scope of the present application. In addition, any reference number in the claims should not be construed as a limitation to the claims. The term "include" does not exclude other apparatuses or steps not listed in the claims or the specification; and the terms "first" and "second" and the like are only used to indicate the name, and do not indicate any specific order.

What is claimed is:

1. A cleaning apparatus for cleaning an inner surface of a film growth reaction chamber, comprising:
    a supporting unit comprising a top surface and a bottom surface;
    a cleaning unit comprising a surface facing the inner surface of the reaction chamber, the surface being provided with a plurality of scraping structures;
    an electric motor provided on the top surface of the supporting unit and comprising a driving shaft, one end of the driving shaft being connected to the cleaning unit so as to drive the cleaning unit to move; and
    a power supply apparatus connected to the electric motor:
    wherein a supporting apparatus is further provided in the reaction chamber, the supporting apparatus comprises a supporting end, the bottom surface of the supporting unit is detachably placed on the supporting end of the supporting apparatus, and the cleaning apparatus is detached from the supporting apparatus and moved out of the reaction chamber after a cleaning process is finished.

2. The cleaning apparatus according to claim 1, further comprising a controller for controlling start and stop of the electric motor.

3. The cleaning apparatus according to claim 1, wherein the cleaning unit comprises a hollow space, and an aggregate collecting apparatus is provided inside the hollow space.

4. The cleaning apparatus according to claim 3, wherein the cleaning unit comprises a first connecting plate, the first connecting plate is provided with a plurality of passages passing through upper and bottom surfaces of the first connecting plate, and the plurality of passages are in fluid communication with the aggregate collecting apparatus.

5. The cleaning apparatus according to claim 1, wherein the inner surface of the reaction chamber comprises a gas transportation surface of a gas transportation apparatus in the reaction chamber.

6. The cleaning apparatus according to claim 1, wherein the inner surface of the reaction chamber comprises an inner side wall of the reaction chamber.

7. The cleaning apparatus according to claim 1, wherein a cavity is provided inside the supporting unit, and the electric motor and the power supply apparatus are provided inside the cavity.

8. A reaction apparatus for film growth on a substrate, comprising:
    a reaction chamber;
    a supporting apparatus provided inside the reaction chamber and comprising a supporting end;
    a substrate carrier configured to convey and support the substrate, wherein the substrate carrier is detachably placed on the supporting end of the supporting apparatus and contacts with the supporting end of the supporting apparatus at least during the film growth process, and the substrate carrier is removed from the supporting apparatus and moved out of the reaction chamber before a cleaning process is performed so as to load or unload the substrate;
    a cleaning apparatus, wherein the cleaning apparatus is detachably placed on the supporting end of the supporting apparatus and contacts with the supporting end of the supporting apparatus at least during a cleaning process, the cleaning apparatus is removed from the supporting apparatus and moved out of the reaction chamber after the cleaning process is finished, and the cleaning apparatus comprises:
    a supporting unit comprising a top surface and a bottom surface;
    a cleaning unit comprising a surface facing an inner surface of the reaction chamber, the surface being provided with a plurality of scraping structures;
    an electric motor provided on the top surface of the supporting unit and comprising a driving shaft, one end of the driving shaft being connected to the cleaning unit so as to drive the cleaning unit to move; and
    a power supply apparatus connected to the electric motor.

9. The reaction apparatus according to claim 8, wherein a gas transportation apparatus is further provided inside the reaction chamber and comprises a gas transportation surface, and the inner surface of the reaction chamber comprises the gas transportation surface.

10. The reaction apparatus according to claim 8, wherein the inner surface of the reaction chamber comprises an inner side wall of the reaction chamber.

11. The reaction apparatus according to claim 8, further comprising a suction port in fluid communication with the inside of the reaction chamber, wherein the suction port is connected to an air exhaust pump or a blower.

12. The reaction apparatus according to claim 11, wherein the suction port is provided in a bottom portion or a side wall of the reaction chamber.

13. The reaction apparatus according to claim 11, wherein the suction port is provided in a side wall of the reaction chamber and located at a position close to the scraping structures of the cleaning apparatus.

14. The reaction apparatus according to claim 11, further comprising an aggregate collecting apparatus in fluid communication with the suction port, the aggregate collecting apparatus being configured to collect adhered aggregates.

15. The reaction apparatus according to claim 11, wherein an aggregate collecting apparatus in fluid communication with the suction port is provided inside the cleaning apparatus, and the aggregate collecting apparatus is configured to collect adhered aggregates.

16. The reaction apparatus according to claim 8, further comprising a mechanical conveying apparatus located outside the reaction chamber, wherein the mechanical conveying apparatus comprises a conveying robot, the conveying robot is configured to selectively convey the cleaning apparatus or the substrate carrier into the reaction chamber from the outside of the reaction chamber, place the cleaning apparatus or the substrate carrier onto the supporting apparatus, or remove the cleaning apparatus or the substrate carrier from the supporting apparatus and convey the cleaning apparatus or the substrate carrier to the outside of the reaction chamber.

17. The reaction apparatus according to claim 8, wherein the cleaning apparatus further comprises a barrier apparatus provided in a peripheral of the plurality of scraping structures and encircling the plurality of scraping structures.

18. The reaction apparatus according to claim 9, wherein a barrier apparatus is further provided in the reaction chamber, and the barrier apparatus is provided adjacent to a peripheral of the gas transportation apparatus and encircles the plurality of scraping structures of the cleaning apparatus.

19. A cleaning apparatus for cleaning an inner surface of a film growth reaction chamber, comprising:
a supporting unit comprising a top surface and a bottom surface;
a cleaning unit comprising a surface facing the inner surface of the reaction chamber, the surface being provided with a plurality of scraping structures;
an electric motor provided on the top surface of the supporting unit, comprising a driving shaft and configured to provide a rotation motion;
a motion converting mechanism provided between the driving shaft of the electric motor and the cleaning unit, and configured to convert the rotation motion of the electric motor into other motions and to drive the cleaning unit to make the other motions; and
a power supply apparatus connected to the electric motor;
wherein a supporting apparatus is provided in the reaction chamber, the supporting apparatus comprises a supporting end, the bottom surface of the supporting unit is detachably placed on the supporting end of the supporting apparatus and contacts with the supporting end of the supporting apparatus at least during a process of cleaning the inner surface of the film growth reaction chamber, and the cleaning apparatus is detached from the supporting apparatus and moved out of the reaction chamber after a cleaning process is finished.

20. The cleaning apparatus according to claim 19, further comprising a controller for controlling start and stop of the electric motor.

21. The cleaning apparatus according to claim 19, wherein the cleaning unit comprises a hollow space, and an aggregate collecting apparatus is provided inside the hollow space.

22. The cleaning apparatus according to claim 21, wherein the cleaning unit comprises a first connecting plate, the first connecting plate is provided with a plurality of passages passing through upper and bottom surfaces of the first connecting plate, and the plurality of passages is in fluid communication with the aggregate collecting apparatus.

23. The cleaning apparatus according to claim 19, wherein the inner surface of the reaction chamber comprises a gas transportation surface of a gas transportation apparatus in the reaction chamber and an inner side wall of the reaction chamber.

24. The cleaning apparatus according to claim 19, wherein a cavity is provided inside the supporting unit, and the electric motor and the power supply apparatus are provided inside the cavity.

25. The cleaning apparatus according to claim 19, wherein the other motions comprises one motion or a combination of at least two motions selected from: a linear motion, a linear reciprocating motion, a curve reciprocating motion, a rotation motion not rotating around a fixed center, an elliptical motion, a swing motion and a vibration motion.

26. A reaction apparatus for film growth on a substrate, comprising:
a reaction chamber;
a supporting apparatus provided inside the reaction chamber and comprising a supporting end;
a substrate carrier configured to convey and support the substrate, wherein the substrate carrier is detachably placed on the supporting end of the supporting apparatus and contacts with the supporting end of the supporting apparatus at least during the film growth process, and the substrate carrier is removed from the supporting apparatus and moved out of the reaction chamber before a cleaning process is performed so as to load or unload the substrate;
a cleaning apparatus, wherein the cleaning apparatus is detachably placed on the supporting end of the supporting apparatus and contacts with the supporting end of the supporting apparatus at least during a cleaning process, the cleaning apparatus is removed from the supporting apparatus and moved out of the reaction chamber after a cleaning process is finished, and the cleaning apparatus comprises:
a supporting unit comprising a top surface and a bottom surface;
a cleaning unit comprising a surface facing an inner surface of the reaction chamber, the surface being provided with a plurality of scraping structures;
an electric motor provided on the top surface of the supporting unit, comprising a driving shaft and configured to provide a rotation motion;
a motion converting mechanism provided between the driving shaft of the electric motor and the cleaning unit and configured to convert the rotation motion of the electric motor into other motions and to drive the cleaning unit to make the other motions; and
a power supply apparatus connected to the electric motor.

27. The reaction apparatus according to claim 26, wherein a gas transportation apparatus is further provided inside the reaction chamber and comprises a gas transportation surface, and the inner surface of the reaction chamber comprises the gas transportation surface.

28. The reaction apparatus according to claim 26, wherein the inner surface of the reaction chamber comprises an inner side wall of the reaction chamber.

29. The reaction apparatus according to claim 26, further comprising a suction port in fluid communication with the inside of the reaction chamber, wherein the suction port is connected to an air exhaust pump or a blower.

30. The reaction apparatus according to claim 29, wherein the suction port is provided in a bottom portion or a side wall of the reaction chamber.

31. The reaction apparatus according to claim 29, wherein the suction port is provided in a side wall of the reaction chamber and located at a position close to the scraping structures of the cleaning apparatus.

32. The reaction apparatus according to claim 29, further comprising an aggregate collecting apparatus in fluid communication with the suction port, the aggregate collecting apparatus being configured to collect adhered aggregates.

33. The reaction apparatus according to claim 29, wherein an aggregate collecting apparatus in fluid communication with the suction port is provided inside the cleaning apparatus, and the aggregate collecting apparatus is configured to collect adhered aggregates.

34. The reaction apparatus according to claim 26, further comprising a mechanical conveying apparatus located outside the reaction chamber, wherein the mechanical conveying apparatus comprises a conveying robot, the conveying robot is configured to selectively convey the cleaning apparatus or the substrate carrier into the reaction chamber from the outside of the reaction chamber, place the cleaning apparatus or the substrate carrier onto the supporting apparatus, or remove the cleaning apparatus or the substrate carrier from the supporting apparatus and convey the cleaning apparatus or the substrate carrier to the outside of the reaction chamber.

35. The reaction apparatus according to claim 26, wherein the cleaning apparatus further comprises a barrier apparatus provided in a peripheral of the plurality of scraping structures and encircling the plurality of scraping structures.

36. The reaction apparatus according to claim 26, wherein a barrier apparatus is further provided in the reaction chamber, and the barrier apparatus is provided adjacent to a peripheral of the gas transportation apparatus and encircles the plurality of scraping structures of the cleaning apparatus.

37. The reaction apparatus according to claim 26, wherein the other motions comprises one motion or a combination of at least two motions selected from: a linear motion, a linear reciprocating motion, a curve reciprocating motion, a rotation motion not rotating around a fixed center, an elliptical motion, a swing motion and a vibration motion.

\* \* \* \* \*